US007804290B2

(12) United States Patent
Henzler et al.

(10) Patent No.: US 7,804,290 B2
(45) Date of Patent: Sep. 28, 2010

(54) EVENT-DRIVEN TIME-INTERVAL MEASUREMENT

(75) Inventors: Stephan Henzler, Taufkirchen (DE); Matthias Schobinger, Munich (DE)

(73) Assignee: Infineon Technologies, AG, Neubiberg (DE)

( * ) Notice: Subject to any disclaimer, the term of this patent is extended or adjusted under 35 U.S.C. 154(b) by 231 days.

(21) Appl. No.: 11/855,415

(22) Filed: Sep. 14, 2007

(65) Prior Publication Data

US 2009/0072812 A1 Mar. 19, 2009

(51) Int. Cl.
*G01R 13/02* (2006.01)
*G01R 19/00* (2006.01)

(52) U.S. Cl. ................................ 324/76.82; 324/76.11

(58) Field of Classification Search ................ 324/535, 324/512, 500, 76.82, 76.77, 76.11
See application file for complete search history.

(56) References Cited

U.S. PATENT DOCUMENTS 4,678,345 A * 7/1987 Agoston ..................... 368/119
7,012,248 B2 * 3/2006 Paschalidis ................. 250/287
7,539,793 B2 * 5/2009 Foster et al. .................. 710/61
2001/0017485 A1 * 8/2001 Yoo ............................ 307/66
2004/0183517 A1 * 9/2004 Reilly et al. ............. 324/76.11
2007/0238362 A1 * 10/2007 Newman et al. ....... 439/620.24
2007/0294495 A1 * 12/2007 Uchida et al. ............... 711/162
2008/0100305 A1 * 5/2008 Gass et al. .................. 324/536

* cited by examiner

*Primary Examiner*—Hoai-An D Nguyen
(74) *Attorney, Agent, or Firm*—Banner & Witcoff, Ltd.

(57) ABSTRACT

An apparatus including a circuit configured to measure timing between features in a first signal only referring to timing information contained in the signal itself.

22 Claims, 4 Drawing Sheets

EVENT-DRIVEN TIME-INTERVAL MEASUREMENT

BACKGROUND

There are many applications in which the accurate measurement of a time interval is useful. For example, accurate time interval measurement is often used in various measurement and instrumentation applications, in analog-to-digital converters based on pulse-width modulation, in digital phase-locked loops, and in mass spectrometer time-of-flight measurements. It is also expected to that being able to accurately measure a time interval will become important in future technologies, such as for the operation of digitally-assisted radio frequency circuits, and also as data rates in general become faster.

Time interval measurements are typically performed between two trigger events (a start event and an end event). Conventionally, the time difference between trigger events has been measured by referring to a clock signal having a known frequency. The detection time of one or both trigger events is rounded to the nearest clock cycle. The number of clock cycles occurring between the trigger events is counted, and with this count plus the known clock frequency, the time interval can be determined. However, this clock-based method results in a rough time measurement having an error that depends upon the clock frequency.

For large time intervals, the error may be reduced to an acceptable level by increasing the reference clock frequency. But for small time intervals, the reference clock frequency would need to be impractically large. Hence, a time-to-digital converter (TDC) is often used to quantize the measurement error at the beginning and end of the time interval. The results of the TDC measurements are added to or subtracted from the rough time measurement to produce a more accurate time measurement.

There are various problems with this conventional TDC approach. For instance, the reference clock is susceptible to jitter, thereby reducing the accuracy of the measurements. Also, a high frequency clock consumes a relatively large amount of power, which is especially problematic where the circuitry for the clock exists solely for operating the TDC. In such a case, a complete phase-locked loop including a voltage-controlled oscillator is needed, further increasing the power penalty. Moreover, a dedicated TDC clock consumes precious real estate—typically a resource in short supply—when implemented on an integrated circuit.

SUMMARY

Various aspects are described herein. For example, an apparatus is described including a circuit that is configured to measure timing between features in a first signal referring only to timing information contained in the signal itself Other illustrative apparatuses are also described, and methods of operation of the various apparatuses are further described.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein.

DETAILED DESCRIPTION

The various aspects described herein may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled," "connected," and "interconnected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements.

As previously described, there are many potential problems with using a time-to-digital converter (TDC) that relies on a reference clock. Therefore, it may be desirable to accurately measure time intervals without the need for a reference clock. One way this may be accomplished is to provide an event-driven time measurement device having one or more TDCs, where each TDC measures a time interval between trigger events in a signal to be measured based on nothing more than the relative timing of the trigger events. The device may be configured to extract timing control signals from features of the signal being measured itself, without the need for a reference clock. Such features in the signal being measured may include, for example, transitions (e.g., transitioning from a logical 0 to a logical 1, and vice versa) and/or spikes.

Providing TDC-based time measurement without relying on a reference clock may potentially overcome one or more of the above-described problems in conventional TDC-based devices. For instance, such a device may be made smaller, and may consume less power, in that special clock circuitry may no longer be needed. Moreover, time intervals may potentially be even more accurately measured, in that clock jitter may no longer be a source of error.

Figure 1:
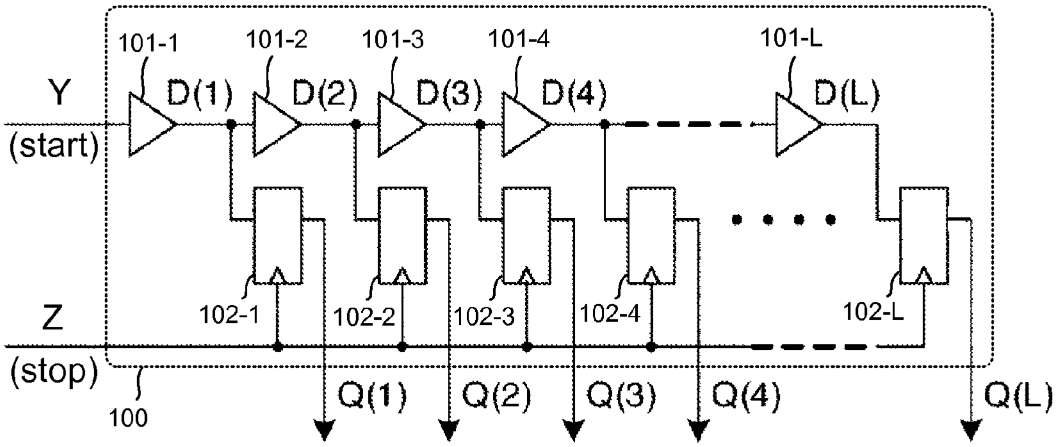
FIG. 1 is a schematic diagram of an illustrative embodiment of a time-to-digital converter.

An illustrative embodiment of a TDC 100 is shown in FIG. 1. In this example, TDC 100 has two inputs, one for a signal Y and the other for a signal Z. Signal Y propagates through a delay chain made up of a plurality of L nodes in series and separated by delay elements 101-1, 101-2, . . . 101-L. Each delay element may be any circuit element that delays the propagation of signal Y, such as but not limited to one or more logic gates (e.g., an OR gate, or one or more inverters), buffers, amplifiers, or delay trace lines. Each delay element may produce a predetermined known delay.

Each node in the chain is further connected to the data input of a respective latch 102-1, 102-2, . . . 102-L, as shown. Each latch 102 is clocked to signal Z, and each latch 102 has a respective data output Q(1), Q(2), . . . Q(L). Thus, in operation, as signal Y propagates through the delay chain, signal Z may be used as a trigger to take a snapshot of the signal values at each node, which are output on lines Q in response to signal Z. Another way to look at this is that signal Y acts as a "start" signal for time interval measurement, and signal Z acts as a "stop" signal.

Outputs Q(1) through Q(L) may collectively represent a series of data bits that together may represent the time interval measured (referred to as a pseudo thermometer code). Proper interpretation of outputs Q(1) through Q(L) is a known process and thus does not need to be described in detail herein.

There are many known variations on the type of TDC shown in FIG. 1. For instance, delay chains may be linear as shown or in the form of an endless loop. Also, other types of TDCs are known such as parallel scaled delay chain TDCs, regular and folded Vernier delay-chain TDCs, hybrid TDCs, and pulse-shrinking TDCs. However, in all of these TDC types, the TDC measures a time interval using signal Y as a start signal and signal Z as a stop signal. Although FIG. 1 shows a particular type of delay chain TDC, any type of TDC as appropriate may be used in the various embodiments described herein.

Traditionally, signal Y has been the signal to be measured (e.g., measuring the width of a pulse in signal Y), also referred to as the start signal; and signal Z has been the reference clock, also referred to as the stop signal. However, as will be described below with reference to several illustrative embodiments, both signals Y and Z may be the signal to be measured and/or based on the signal to be measured, without the need for a reference clock.

Figure 2:
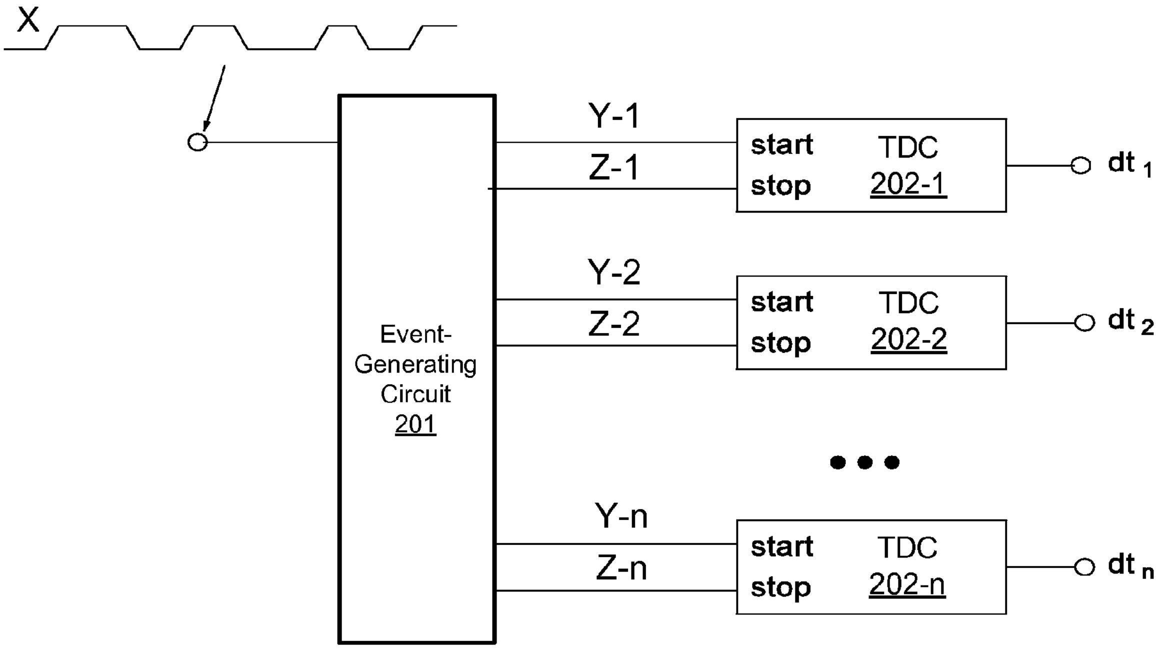
FIG. 2 is a schematic diagram of an illustrative embodiment of an event-driven device for performing time interval measurement on a signal.

An illustrative embodiment of such a configuration that does not need a reference clock to measure time is shown in FIG. 2. In this example, an event-generating circuit 201 is configured to receive a signal X and to output a plurality of trigger event signals Y-1, Y-2, . . . Y-n and Z-1, Z-2, . . . Z-n. The trigger event signals Y, Z in this embodiment depend only upon signal X, and thus do not need to depend upon any other signal independent from signal X and/or having a known period or frequency, such as a reference clock signal. The device in FIG. 2 does not need to generate, receive, or otherwise refer to such a reference clock, and may refer only to the timing information in signal X itself. A plurality of n TDCs 202-1, 202-2, . . . 202-*n* each receives a respective pair of signals Y and Z as shown. Each TDC 202, in turn, outputs a respective signal dt1, dt2, . . . dtn, as shown. Each output signal dt represents a time difference, which is the length of time of the interval being measured. Each TDC 202 may be any type of TDC. For instance, each TDC 202 may be implemented as TDC 100, where output signal dt may be the collection of outputs Q(1) through Q(L) in FIG. 1.

Event-generating circuit 201 may be configured in any of a number of ways, depending upon the function desired of the device. In general, event-generating circuit 201 may be configured to generate signals Y and Z based on input signal X, where signals Y and Z may be generated irrespective of any reference clock. For example, event-generating circuit 201 may be configured to change the value of signal Y in response to a rising edge in signal X, and to change the value of signal Z in response to a falling edge in signal X.

Figure 3:
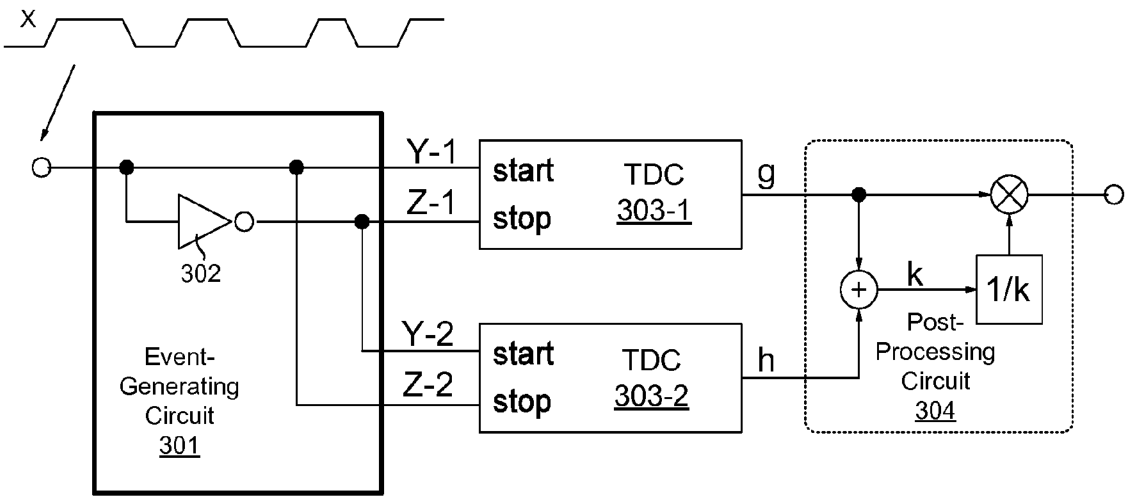
FIG. 3 is a schematic diagram of an illustrative embodiment of an event-driven device for determining the duty cycle of a signal.

Another illustrative embodiment is shown in FIG. 3, which is configured to determine the duty cycle of input signal X, where signal X is a periodic or quasi-periodic signal. The example of FIG. 3 has an event-generating circuit 301, two TDCs 303-1 and 303-2, and a post-processing circuit 304. Event-generating circuit 301 receives signal X and generates signal Y-1, which is equal to signal X. In this case, event-generating circuit 301 may "generate" signal Y-1 simply by passing through unprocessed signal X. Event-generating circuit 301 also generates signal Z-1 by inverting signal X, such as by using an inverter 302. In this example, signal Y-2 equals signal Z-1, and signal Z-2 equals signal Y-1. As in the other embodiments, signals Y, Z in this embodiment depend only upon signal X, and thus do not need to depend upon any other signal independent from signal X and/or having a known period or frequency, such as a reference clock signal. The device in FIG. 3 does not need to generate, receive, or otherwise refer to such a reference clock, and may refer only to the timing information that is in signal X itself.

Figure 4:
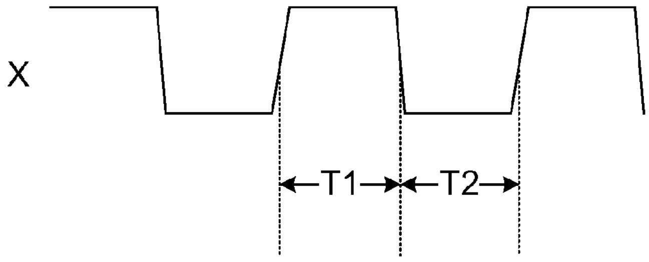
FIG. 4 is a graph of an illustrative signal to be measured.

Thus, each TDC 303 in this example receives the opposite start and stop signals, such that TDC 303-1 measures the time interval where signal X is high and outputs this measurement as signal g, and TDC 303-2 measures the time interval where signal X is low and outputs this measurement as signal h. More specifically, referring to illustrative signal X in FIG. 4, signal g represents time interval T1 and signal h represents time interval T2.

Post-processing circuit 304 receives signals g and h and determines the duty cycle of signal X by dividing the time interval represented by signal g by the sum of the time intervals represented by signals g and h. The result is the ratio of time that signal X is at a value of 1 and the actual period of signal X. This measurement and calculation by the device of FIG. 3 may occur repeatedly over a plurality of cycles of signal X as desired.

Figure 5:
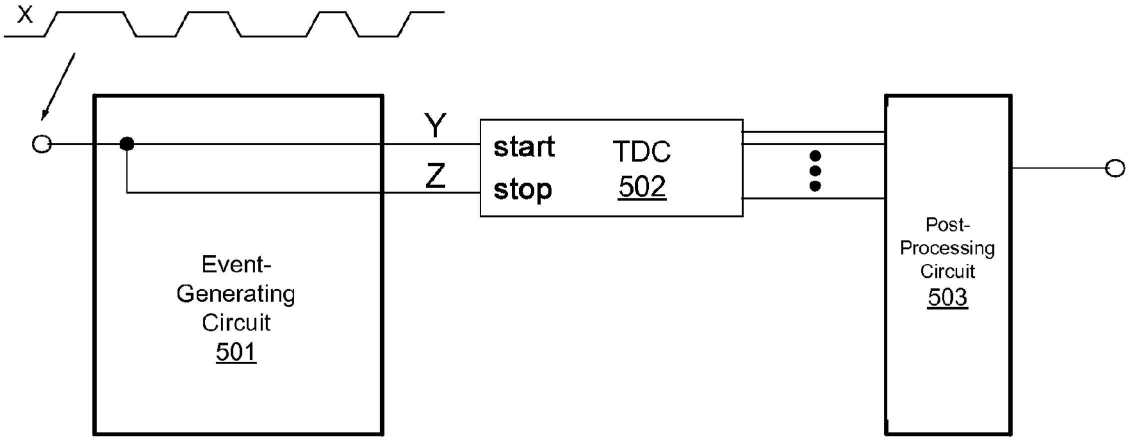
FIG. 5 is a schematic diagram of another illustrative embodiment of an event-driven device for determining the duty cycle of a signal.

In the device of FIG. 3, the TDCs may or may not have a dead time. That is, each TDC 303 may or may not be able to start a time interval measurement instantaneously with the stopping of a previous time interval measurement. An example of a TDC normally having considerable dead time is a pulse-shrinking TDC or a looped delay chain TDC. Where a TDC is used that has no dead time, it may be desirable to take advantage of this property. For instance, FIG. 5 shows an illustrative embodiment that also measures the duty cycle of signal X, but using only a single TDC 502 of a type that has no dead time. Additionally, TDC 502 in FIG. 5 may have the capability to measure multiple time intervals instantaneously. On the arrival of the stop signal, TDC 402 may measure time intervals occurring between the stop signal and n previous start signals and/or m previous stop signals, and may provide the results of these measurements at its outputs in digital representation.

The duty cycle as determined by the device of FIG. 3 is a relative quantity. A relative quantity is a quantity having no reference to an absolute time scale, and is a quotient of two linear combinations of time intervals. In this example, each of the two time intervals in the quotient are measured by different TDCs. For relative quantities, the measurement result does not depend upon the absolute resolution of the TDCs. This may be desirable because the resolution of a TDC may vary due to process variations and variations in operating conditions (e.g., voltage, temperature, aging, etc.). However, where both TDCs vary linearly and fairly simultaneously (which may be expected when variations are due to shared environmental factors), the ratio of the TDC results may reduce or even eliminate the impact of this variation.

It is noted that the embodiments described herein are not limited to determining relative quantities. Rather, various embodiments may be used to determine relative quantities, absolute quantities, or both, depending upon the configuration of the device. For the measurement of absolute quantities, analog or digital calibration may be used to cancel out any impact of process variations.

In FIG. 5, an illustrative event-generating circuit 501 is shown that is a special case. In this example, event-generating circuit 501 generates signals Y and Z simply by passing through signal X. That is, signals Y and Z are each equal to signal X. Thus, signal X effectively both starts and stops TDC 502, which has the ability to stop the current measurement, to make the result available at its output, and to start a new measurement instantaneously even though the start and stop signals may arrive at exactly the same time. For the calculation of the duty cycle, both the high and low phases of signal X are measured by TDC 502. To do so, TDC 502 can detect more than one previous signal X transition. Upon the occurrence of a stop signal, TDC 502 measures not only the time difference from the previous start signal but also from the n preceding start and stop signals. An example of such a TDC with these abilities is a conventional unlooped delay chain based TDC, where the delay line is long enough to store multiple signal transitions within the delay chain. In addition, such a TDC may be able to measure the time between a rising and falling edge and simultaneously the time between the rising edge and the subsequent rising edge.

As in the other embodiments, signals Y, Z in this embodiment depend only upon signal X, and thus do not need to depend upon any other signal independent from signal X and/or having a known period or frequency, such as a reference clock signal. The device in FIG. 5 does not need to generate, receive, or otherwise refer to such a reference clock, and may refer only to the timing information in signal X itself.

A post-processing circuit 503 is configured in this example to receive multiple outputs from TDC 502 digitally indicating the measured position of a rising or falling transition of the signal propagating along the delay chain. Post-processing circuit 503 is configured to calculate the appropriate duty cycle ratio from these outputs. Of course, post-processing circuit 503 may be configured to determine relative and/or absolute quantities other than a duty cycle ratio.

Figure 6:
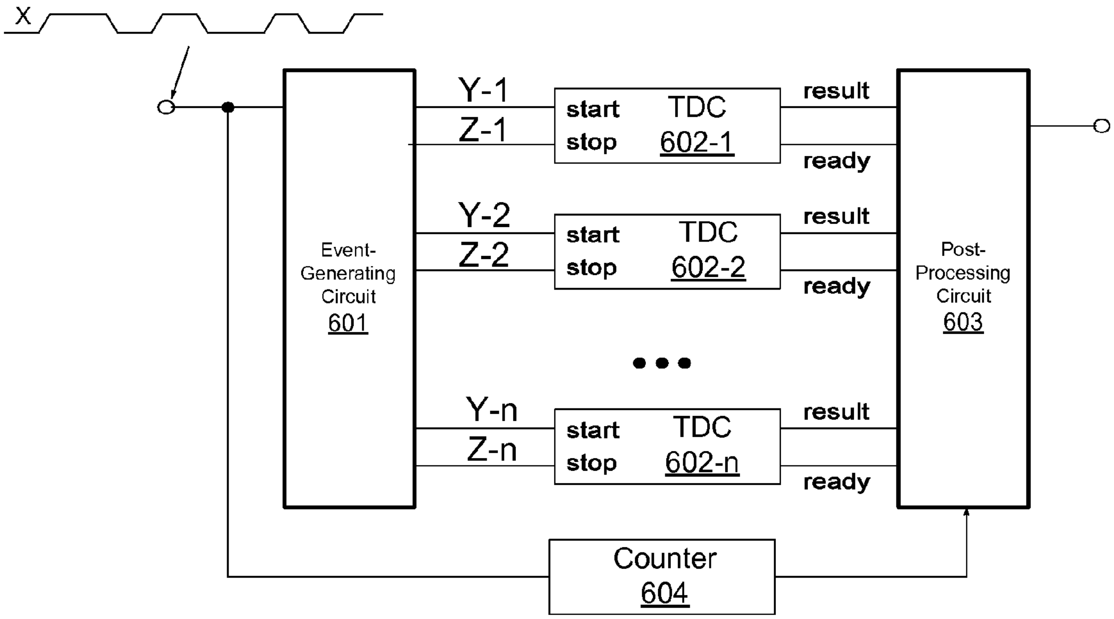
FIG. 6 is a schematic diagram of an illustrative embodiment of an event-driven device for performing time interval measurement on a signal over multiple signal cycles.

Referring to another illustrative embodiment, FIG. 6 shows a device similar to the device of FIG. 2. One different is that a counter 604 is included. Counter 604 in this embodiment allows the device to run measurements for at least a predetermined number of multiple cycles of signal X (where X is periodic or quasi-periodic) before making a final calculation. Thus, counter 604 counts the number of cycles in signal X (in this example, X is periodic or quasi-periodic), and outputs the count to post-processing circuit 603. In turn, post-processing circuit 603 uses the count to determine when all time interval measurements desired for the final calculation are available from TDCs 602.

For example, it may be desired that the device of FIG. 6 take certain measurements over five cycles of X. In that case, TDCs 602 will take interval measurements and provide the results to post-processing circuit 603 until counter 604 counts five cycles of X. In response to counter 604 counting the predetermined number of cycles, post-processing circuit 603 will make its final calculation based on the various interval measurements received up to that point.

In alternative embodiments, each TDC 602 may generate a "ready" signal as shown, indicating that the particular TDC 602 has completed a measurement. Where such ready signals are used in TDCs, counter 604 may not be needed or desirable. The ready signals may be generated in a variety of ways, depending upon the type of TDC. For instance, a pulse-shrinking TDC may generate the ready signal in response to the pulse vanishing, which may be detected when the oscillation in the loop has vanished. Or, a Vernier TDC may include or be coupled to logic that detects a transition in the thermometer code already acquired.

Again, as in the other embodiments, signals Y, Z in this embodiment depend only upon signal X, and thus do not need to depend upon any other signal independent from signal X and/or having a known period or frequency, such as a reference clock signal. The device in FIG. 6 does not need to generate, receive, or otherwise refer to such a reference clock, and may refer only to the timing information in signal X itself.

A device according FIG. 6 may be also configured in a way to calculate a complex time quantity from multiple time interval measurements covering multiple cycles of the input signal X in a stream like manner. This would mean that, for each period of the input signal X, an appropriate output value is generated at the output of the post-processing circuit 603. For the calculation of this output, value time interval measurements from n previous cycles of X may be used. These time intervals may be provided by the TDCs. The actual counter value may indicate to the post-processing circuit which TDC output value corresponds to which cycle in the past.

Figure 7:
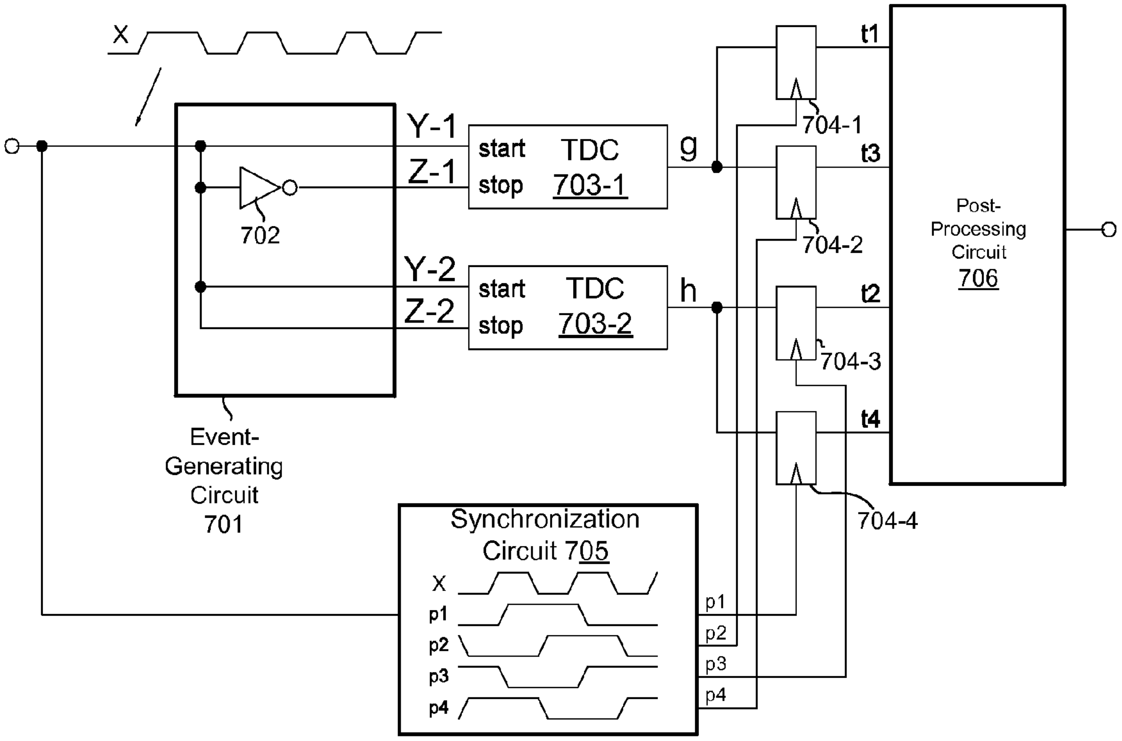
FIG. 7 is a schematic diagram of an illustrative embodiment of an event-driven device for determining the first derivative of the duty cycle of a signal.

Another illustrative embodiment is shown in FIG. 7. In this example, the device includes an event-generating circuit 701, two TDCs 703-1 and 703-2, four latches 704-1, 704-2, 704-3, and 704-4, a synchronization circuit 705, and a post-processing circuit 706. This device calculates the first derivative of the duty cycle of signal X. In this example, TDCs 703 have the property that they have no dead time.

In FIG. 7, event-generating circuit 701 includes an inverter 702, and is configured to generate signals as follows: signals Y-1, Y-2, and Z-2, each of which equals X; and signal Z-1, which equals the inverse of signal X. As in other embodiments, signals Y are used as a start signal by TDCs 703, and signals Z are used as a stop signal by TDCs 703. TDC 703-1 outputs result signal g, and TDC 703-2 outputs result signal h. Signals g and h each represents the time interval measured by the respective TDC. As in the other embodiments, signals Y, Z depend only upon signal X, and thus do not need to depend upon any other signal independent from signal X and/or having a known period or frequency, such as a reference clock signal. The device in FIG. 7 does not need to generate, receive, or otherwise refer to such a reference clock, and may refer only to the timing information in signal X itself.

Latches 704 receive signals g and h into their data inputs as shown, and output signals t1, t2, t3, and t4 as shown. Latches 704 are each clocked by one of signals p1, p2, p3, and p4 generated by synchronization circuit 705 as shown. Signal p1 flips value in response to rising edges in signal X, signal p2 flips value in response to falling edges in signal X, signal p3 is the inverse of signal p1, and signal p4 is the inverse of signal p2. Thus, signals t1 and t3 are differently delayed versions of signal g, and signals t2 and t4 are differently delayed versions of signal h.

Post-processing circuit 706 receives signals t1 through t4 and, in this example, is configured to perform the following calculation: $output=(t3t2-t1t4)/(t2^2t4+t2t4^2)$ to calculate the first derivative of the duty cycle of signal X. This output of post-processing circuit 706 may be updated as new values of t1 through t4 are presented by the outputs of latches 704.

Figure 8:
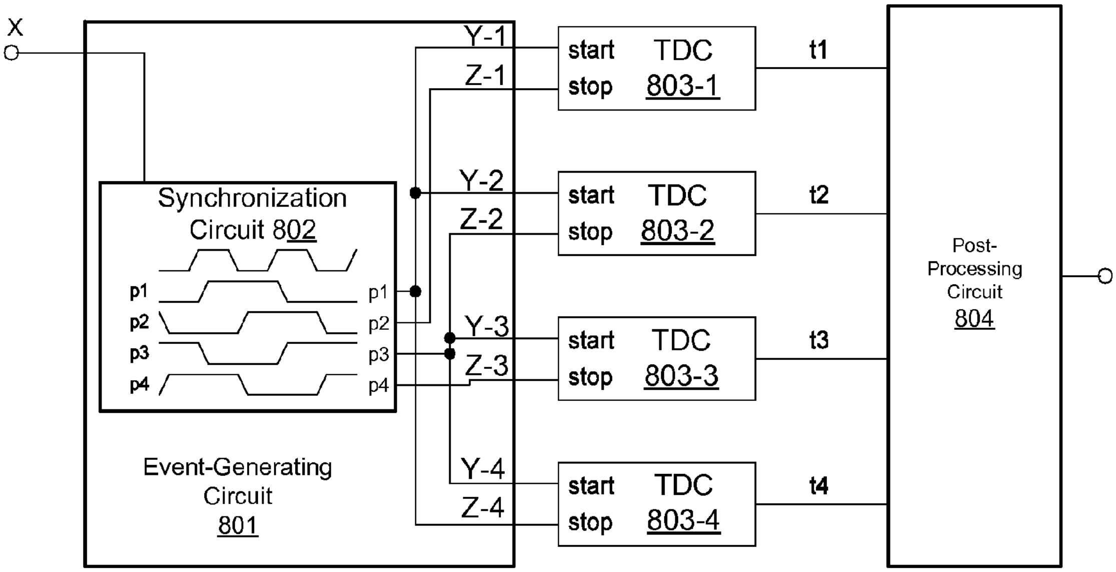
FIG. 8 is a schematic diagram of another illustrative embodiment of an event-driven device for determining the first derivative of the duty cycle of a signal.

FIG. 8 shows yet another illustrative embodiment that also calculates the first derivative of the duty cycle of signal X, except in this case this device allows the TDCs to have a dead time. In this case, four TDCs 803-1, 803-2, 803-3, and 803-4 are used, rather than two as in the embodiment of FIG. 7. Again, signals Y, Z depend only upon signal X, and thus do not need to depend upon any other signal independent from signal X and/or having a known period or frequency, such as a reference clock signal. As in the previous embodiments, the device in FIG. 8 does not need to generate, receive, or otherwise refer to such a reference clock, and may refer only to the timing information in signal X itself.

In the embodiment of FIG. 8, a synchronization circuit 802 is part of (or the entirety of) an event-generating circuit 801, and is used to produce start and stop signals to TDCs 803 as shown, rather than to control latches as in the embodiment of FIG. 6. Although in a different location, synchronization circuit 802 is configured to generate signals p1 through p4 in the same manner as synchronization circuit 705.

A post-processing circuit 804 performs the same calculation as post-processing circuit 706, that is: the output of post-processing circuit 804=$(t3t2-t1t4)/(t2^2t4+t2t4^2)$. In this embodiment, signals t1 through t2 may be passed directly from TDCs 703 into post-processing circuit 804.

In each of the various illustrative embodiments described herein, the devices may interface with another device or may be incorporated into a larger device. In either of these cases, it may be desirable that the determined quantity (e.g., raw time intervals, duty cycles, first derivatives of duty cycles, etc.) output by the device be made available to the other device or to another portion of the larger device. These other circuits may be asynchronous to the time-determining devices described herein, especially since the time-determining devices are event-based and are not necessarily clocked. Accordingly, it may be desirable to make the output available to the other circuits when they are ready to fetch the output, such as by storing the output in one or more latches or another type of buffer. For instance, a first-in-first-out (FIFO) buffer may be used to store the post-processing circuit output so that it is ready when the other circuits need the output.

Thus, various illustrative embodiments of event-driven time measurement devices have been described. By extracting timing control signals from the signal being measured itself, various potential disadvantages stemming from using a reference clock may be avoided.

It is further noted that the above embodiments are merely examples. It is within the scope of this disclosure to combine various aspects of the different embodiments to produce variations thereof. For example, any combination of event-generating circuits and post-processing circuits may be used in order to obtain the desired result. In addition, while various types of TDCs may be used in the embodiments described herein, these embodiments may required minor modification to accommodate different TDC types. These modifications are well within the capability of one of ordinary skill in the art, without requiring undue experimentation. For example, the event generation circuit and/or the post-processing circuit may be modified depending upon the type of TDC used. Moreover, while several of the described embodiments measure time intervals and generate signals Y and Z based on transitions in signal X, these and other embodiments may additionally or alternatively measure time intervals and generate signals Y and Z based on other features of signal X, such as spikes in signal X, the crossing of a predetermined reference level, and/or the occurrence of a signal change with at least a certain predetermined rate of change.

The invention claimed is:

1. An apparatus, comprising:

an event-generating circuit configured to generate trigger event signals based on an input signal; and a first time-to-digital converter having a first start input and a first stop input, wherein the first start input and the first stop input are each coupled to the event-generating circuit to receive at least one of the trigger event signals, wherein the first time-to-digital converter is configured to generate an output signal representing a length of time that starts and stops depending upon those of the trigger event signals received by the first start input and the first stop input, without reference to a clock signal.

2. The apparatus of claim 1, wherein the apparatus is configured such that the first stop input does not receive a signal different from the input signal and having a known frequency or period.

3. The apparatus of claim 1, wherein the apparatus is configured such that the first stop input does not receive a signal independent from the input signal.

4. The apparatus of claim 1, further comprising a second time-to-digital converter having a second start input and a second stop input, wherein the second start input and the second stop input are each coupled to the event-generating circuit to receive at least one of the trigger event signals.

5. The apparatus of claim 4, wherein the first time-to-digital converter is configured to generate a first output and the second time-to-digital converter is configured to generate a second output, the apparatus further comprising a post-processing circuit configured to generate an output based on a combination of the first and second outputs.

6. The apparatus of claim 5, wherein the post-processing circuit is configured to generate the output of the post-processing circuit by summing values represented by the first and second outputs and dividing the value represented by the first output by the sum.

7. The apparatus of claim 4, wherein the first time-to-digital converter is configured to generate a first output and the second time-to-digital converter is configured to generate a second output, the apparatus further comprising:

a third time-to-digital converter having a third start input, a third stop input, and a third output, wherein the third start input and the third stop input are each coupled to the event- generating circuit to receive at least one of the trigger event signals;

a fourth time-to-digital converter having a fourth start input, a fourth stop input, and a fourth output, wherein the fourth start input and the fourth stop input are each coupled to the event-generating circuit to receive at least one of the trigger event signals; and a post-processing circuit configured to generate an output based on a combination of the first, second, third, and fourth outputs.

8. The apparatus of claim 7, wherein the post-processing circuit is configured to generate the output of the post-processing circuit in accordance with the following calculation:

$(t3t2-t1t4)/(t2^2t4+t2t4^2)$, wherein tl is a value represented by the first output, t2 is a value represented by the second output, t3 is a value represented by the third output, and t4 is a value represented by the fourth output.

9. The apparatus of claim 4, further comprising a post-processing circuit, wherein the first time-to-digital converter is configured to output a first signal representing a first length of time that starts and stops in response to the trigger event signals received at the first start and stop inputs, wherein the second time-to-digital converter is configured to output a second signal representing a second length of time that starts and stops in response to the trigger event signals received at the second start and stop inputs, and wherein the post-processing circuit is configured to combine the first and second signals.

10. The apparatus of claim 9, wherein the post-processing circuit is configured to combine the first and second signals in a manner comprising summing a value represented by the first signal with a value represented by the second signal.

11. The apparatus of claim 4, further comprising a post-processing circuit, wherein a first one of the trigger event signals equals a second one of the trigger event signals and a third one of the trigger event signals equals an inverse of the second one of the trigger event signals, wherein the first time-to-digital converter is configured to output a first signal representing a first length of time that starts and stops in response to the trigger event signals received at the first start and stop inputs, wherein the second time-to-digital converter is configured to output a second signal representing a second length of time that starts and stops depending upon the first one of the trigger event signals, and wherein the post-processing circuit is configured to combine the first and second signals.

12. The apparatus of claim 1, wherein the first time-to-digital converter is configured to output a signal representing a first length of time that starts and stops in response to the trigger event signals received at the first start and stop inputs.

13. The apparatus of claim 1, wherein the event-generating circuit comprises an inverter configured to receive the input signal and to output one of the trigger event signals.

14. The apparatus of claim 1, wherein one of the trigger event signals is an inverse of another of the trigger event signals.

15. The apparatus of claim 1, wherein the first time-to-digital converter is configured to start a time interval measurement in response to a signal applied to the first start input and to output a time measurement result in response to a signal applied to the first stop input.

16. An apparatus, comprising:

a first circuit portion configured to generate trigger event signals based on an input signal; and a second circuit portion having a first input and a second input, wherein the first input and the second input are each coupled to the first circuit portion to receive at least one of the trigger event signals, wherein the second circuit portion is configured to generate an output signal representing a length of time that starts and stops depending upon the at least one of the trigger event signals, without reference to a clock signal.

17. The apparatus of claim 16, wherein the second circuit portion is configured to output a first signal representing a length of time that starts and stops in response to the at least one of the trigger event signals.

18. The apparatus of claim 17, further comprising:

a third circuit portion coupled to the first circuit portion and configured to output a second signal representing a second length of time that starts and stops depending upon the at least one of the trigger event signals; and a fourth circuit portion coupled to the second and third circuit portions and configured to combine the first and second signals.

19. An apparatus, comprising:

means for generating trigger event signals based on an input signal; and a time-to-digital converter having a start input and a stop input, wherein the start input and the stop input are each coupled to the means for generating so as to receive at least one of the trigger event signals, wherein the time-to-digital converter comprises means for generating an output signal representing a length of time that starts and stops depending upon the event signal, without reference to a clock signal.

20. The apparatus of claim 19, wherein the apparatus is configured to measure timing between features in the input signal referring only to information contained in the input signal itself.

21. An apparatus, comprising:

an event-generating circuit configured to generate trigger event signals based on an input signal;

a first time-to-digital converter coupled to the event-generating circuit and configured to generate a first output based on at least a first one of the trigger event signals;

a second time-to-digital converter coupled to the event-generating circuit and configured to generate a second output based on at least a second one of the trigger event signals;

a post-processing circuit configured to generate an output based on a combination of the first and second outputs;

a storage circuit configured to store values of signals from the first and second outputs and to selectively output the stored values to the post-processing circuit; and a synchronization circuit configured to control, based on features of the input signal, when the storage circuit outputs the stored values to the post-processing circuit.

22. An apparatus, comprising:

an event-generating circuit configured to generate trigger event signals based on an input signal;

a first time-to-digital converter having a first start input and a first stop input, wherein the first start input and the first stop input are each coupled to the event-generating circuit to receive at least one of the trigger event signals;

a second time-to-digital converter having a second start input and a second stop input, wherein the second start input and the second stop input are each coupled to the event-generating circuit to receive at least one of the trigger event signals, wherein the first time-to-digital converter is configured to generate a first output and the second time-to-digital converter is configured to generate a second output;

a post-processing circuit configured to generate an output based on a combination of the first and second outputs;

a storage circuit configured to store values of signals from the first and second outputs and configured to selectively output the stored values to the post-processing circuit; and a synchronization circuit configured to control, based on features of the input signal, when the storage circuit outputs the stored values to the post-processing circuit.

* * * * *

UNITED STATES PATENT AND TRADEMARK OFFICE

CERTIFICATE OF CORRECTION

PATENT NO. : 7,804,290 B2
APPLICATION NO. : 11/855415
DATED : September 28, 2010
INVENTOR(S) : Stephan Henzler et al.

It is certified that error appears in the above-identified patent and that said Letters Patent is hereby corrected as shown below:

On the Title Page under the Inventors name:
Please remove “Schobinger” and insert --Schöbinger--

Signed and Sealed this
Seventeenth Day of May, 2011

David J. Kappos
*Director of the United States Patent and Trademark Office*